United States Patent [19]

Hata et al.

[11] Patent Number: 5,061,468

[45] Date of Patent: Oct. 29, 1991

[54] PROCESS FOR PREPARATION OF ALUMINUM BORATE WHISKER

[75] Inventors: Hajime Hata; Seiji Sogabe; Keizo Oka, all of Marugame, Japan

[73] Assignee: Shikoku Chemicals Corporation, Kagawa, Japan

[21] Appl. No.: 452,420

[22] Filed: Dec. 19, 1989

[30] Foreign Application Priority Data

Dec. 19, 1988 [JP]  Japan .................. 63-320872

[51] Int. Cl.$^5$ ............................................. C01B 35/12
[52] U.S. Cl. ...................... 423/279; 156/DIG. 61; 156/DIG. 112; 423/277; 501/95
[58] Field of Search ............... 501/52, 127, 153, 95; 156/DIG. 112, DIG. 61; 423/277, 279; 264/56

[56] References Cited

U.S. PATENT DOCUMENTS

| 3,080,242 | 3/1963 | Berry | 501/95 |
| 3,350,166 | 10/1967 | Alley et al. | 156/614 |
| 4,774,210 | 9/1988 | Ray | 501/127 |
| 4,789,422 | 12/1988 | Misra | 156/DIG. 61 |

FOREIGN PATENT DOCUMENTS 0296779 12/1988 European Pat. Off. ........... 423/279

OTHER PUBLICATIONS

Bailar et al., *Comprehensive Inorganic Chemistry,* 1973, pp. 1055–1057.

*Primary Examiner*—Gary P. Straub
*Assistant Examiner*—Stephen G. Kalinchak
*Attorney, Agent, or Firm*—Sherman and Shalloway

[57] ABSTRACT

An aluminum borate whisker is prepared by heating and reacting aluminum sulfate and an oxide of boron, an oxyacid of boron or an alkali metal salt thereof in the presence of an alkali metal sulfate and an alkali metal carbonate. In this process, the reaction is advanced apparently in the solid phase, and this process is advantageous over the conventional processes in that the yield is high and the withdrawal of the reaction product is facilitated.

1 Claim, No Drawings

PROCESS FOR PREPARATION OF ALUMINUM BORATE WHISKER

BACKGROUND OF THE INVENTION (1) Field of the Invention

The present invention relates to a process for the preparation of an aluminum borate whisker.

The aluminum borate whisker obtained according to the process of the present invention is excellent in mechanical strength, heat resistance, heat-insulating property, chemical resistance, electrically insulating property and neutron ray-absorbing property, and this whisker is valuable as a reinforcer for a thermoplastic resin, a thermosetting resin, cement, glass or metal.

(2) Description of the Related Art

Various processes have been tried for aluminum borate whiskers excellent in mechanical strength, chemical resistance and other properties, and these processes are roughly divided into the gas phase method and the liquid phase method using a flux.

As the gas phase method, the specification of U.S. Pat. No. 3,350,166 describes that by passing water vapor through gaseous aluminum fluoride and boron oxide at a temperature of 1000° to 1400° C., a whisker having a composition of $4Al_2O_3.B_2O_3$ is obtained.

As the liquid phase method, the specification of U.S. Pat. No. 3,080,242 describes that by heating a mixture of aluminum hydroxide and boron oxide, a whisker having a composition of $3Al_2O_3.B_2O_3$ or $9Al_2O_3.B_2O_3$ is obtained. In this method, excessive boron oxide acts as the flux. Furthermore, from the report of Bureau of Mines, U.S.A., it is known that a whisker having a composition of $2.5Al_2O_3.B_2O_3$ is obtained by heating a mixture of aluminum oxide, sodium tetraborate and lithium chloride at 1200° C. and that a whisker having a composition of $4.8Al_2O_3.B_2O_3$ is obtained by heating a mixture of aluminum oxide, sodium tetraborate and boron oxide at 1400° C. [Bureau of Mines Report of Investigations, 6575 (1965),]. Also in these methods, the excessive sodium tetraborate/lithium chloride mixture or the excessive sodium tetraborate/boron oxide mixture acts as the flux, and in general, the boric acid component is incorporated in an amount of at least three equivalents and the excessive portion acts as the flux.

Non-whisker aluminum borate is obtained by pulverizing and mixing an aluminum source component and a boric anhydride source component and heating the mixture at a temperature of 700° to 1200° C. Since the aluminum source component is solid at the above-mentioned temperature, the reaction becomes heterogeneous and the aluminum source components exists in the reaction products. In order to grow a whisker in this reaction system, it is necessary to make the reaction mixture as homogeneous as possible and maintain a physical space for the growth of the whisker. For this purpose, boron oxide and an alkali metal borate are incorporated as a flux into the reaction mixture.

However, since the boron oxide and alkali metal borate have a high melt viscosity, the growing rate of the whisker is very low. Accordingly, the viscosity of the reaction mixture should be reduced by incorporating an alkali metal chloride or the like. According to this method, a large whisker of aluminum borate can be obtained, but the excessive boric anhydride source component tends to form a multi-component glass matrix together with the aluminum source component and the alkali component and the grown whisker is wrapped with this glass matrix. Therefore, the operation of eluting the glass matrix component becomes necessary and hence, a long time is required for isolation of the whisker. Furthermore, the method is defective in that since a part of the aluminum source component is used as the component of the glass matrix, the yield of the aluminum borate whisker is reduced.

Moreover, in the above-mentioned system, since the whole reaction mixture is completely melted, a reaction vessel having a shape of a crucible is necessary. If a platinum crucible stable to the molten salts is used, although the reaction product can be easily isolated after cooling, the cost of the apparatus increases and the process is not suitable for the industrial manufacturing method.

If ceramic crucible made of alumina, mullite or silica is used, the boron oxide component contained in the molten salt reacts very easily with the material of the crucible and the reactant is completely fusion-sticked to the inner surface of crucible. Accordingly, for the isolation of the whisker, it is necessary that the crucible with the content should be immersed in hydrochloric acid, followed by boiling. In this case, the crucible having the inner surface already deteriorated by the contact with the molten salts is further damaged, and it is impossible to use the crucible repeatedly.

SUMMARY OF THE INVENTION

It is a primary object of the present invention to provide a process for the preparation of an aluminum borate whisker, which is capable of providing an aluminum borate whisker in a high yield without using an expensive reaction vessel, isolation and purification of the reaction product being facilitated, and which is therefore suitable for the production on an industrial scale.

We made research and investigation under the above-mentioned background, and as the result, it was found that this object can be attained by using aluminum sulfate as the aluminum source component and further using an alkali metal carbonate for neutralizing aluminum sulfate and forming a sulfate acting as a flux. We have now completed the present invention based on this finding.

More specifically, in accordance with the process of the present invention, by heating aluminum sulfate as the aluminum source component and at least one boric anhydride source component selected from the group consisting of oxides, oxyacids and alkali metal salts of boron at a temperature of 1000° to 1200° C. in the presence of an alkali metal sulfate as a flux for growing a crystal and an alkali metal carbonate acting as a neutralizing agent for the aluminum sulfate as well as the flux, an aluminum borate whisker can be grown in the state where macroscopically, the entire system is not molten but apparently kept in the solid phase though the flux is microscopically melted.

DETAILED DESCRIPTION OF THE PREFERRED EMBODIMENTS

In the process of the present invention, alumina and an alkali metal sulfate should be formed by subjecting aluminum sulfate and an alkali metal carbonate in the powdery state to neutralization reaction at a temperature of 500° to 600° C. The aluminum sulfate and alkali metal carbonate used for this neutralization reaction are preferably fine particulate anhydrides. If water of crystallization is contained, the neutralization reaction takes place at a lower temperature and a good whisker cannot be obtained. Accordingly, anhydrous aluminum sulfate is most preferable as the aluminum source component.

As the boric anhydride source component, there can be mentioned boron oxide, boric acid, pyroboric acid, metaboric acid, sodium tetraborate, potassium tetraborate, sodium metaborate and boron alkoxides such as $B(OC_2H_5)$ When boric acid, pyroboric acid or metaboric acid is used, dehydration reaction takes place at about 100° C., but since the reaction temperature is considerably low and the amount of water formed by the reaction is relatively small, inhibition of the growth of a whisker by the above-mentioned low-temperature neutralization is not substantially caused.

Anhydrous sodium carbonate and anhydrous potassium carbonate can be mentioned as the neutralizing agent for aluminum sulfate.

The whisker obtained by reacting only the above-mentioned three materials is thick and has a small aspect ratio. In order to obtain a fine whisker, it is preferred that an anhydrous alkali metal sulfate such as sodium sulfate or potassium sulfate be added.

In carrying out the process of the present invention, aluminum sulfate is mixed with the boric anhydride source component so that the aluminum/boron molar ratio is from 6/4 to 9/2, the alkali metal sulfate is added so that the alkali metal/aluminum molar ratio is from 1/4 to 2/1, the alkali metal carbonate is added so that the alkali metal/aluminum molar ratio is from 1/1 to 3/1, the starting mixture powder is charged in an alumina crucible, the temperature elevated at a rate of 2° to 50° C. per minute and the mixture is finally maintained at a temperature of 1000° to 1200° C. for 30 minutes to 8 hours to effect reaction, whereby an aluminum borate whisker having the composition of $9Al_2O_3.2B_2O_3$ can be grown. In this case, if the starting mixture powder is tabulated or molded by using a non-aqueous binder and the molded bulk is placed on a ceramic plate of an electric furnace and reacted under the same temperature condition as described above, a whisker can be grown without using any reaction vessel.

If the aluminum/boron ratio is lower than 6/4, that is, the proportion of boron increases the above-mentioned range, or if the molar ratio of the alkali metal salt of the alkali metal carbonate to aluminum is outside the above-mentioned range, the entire system is fused and therefore, a whisker cannot be grown unless a reaction vessel is used. If the molar ratio of the alkali metal of the alkali metal carbonate to aluminum exceeds 3/1, that is, the proportion of the alkali metal increases, α-alumina and β-alumina are formed. The reason resembling the alkali melt decomposition takes carbonate is left after the neutralization reaction, a reaction resembling the alkali melt decomposition takes place and aluminum borate is not formed or if aluminum borate is formed, this aluminum borate is decomposed.

For isolation of the aluminum borate whisker from the reaction product containing the flux, the flux and other water-soluble substances are removed by using hot hydrochloric acid, hot sulfuric acid, hot nitric acid or hot caustic soda having a concentration of about 1N or hot water, and the residue is sufficiently washed with water. When water-insoluble by-products are contained, the whisker is separated from the above-mentioned residue by decantation or the like and the recovered whisker is sufficiently washed with water.

In general, the so-obtained aluminum borate whisker has a thickness of 0.5 to 5 μm and a length of 10 to 100 μm.

In the process of the present invention, when aluminum sulfate, the boric anhydride source component, the alkali metal sulfate and the alkali metal carbonate are heated and the temperature is elevated, if boric acid is used as the boric anhydride source component, boric acid is dehydrated at 100° to 200° C. to form boron oxide. If the temperature is further elevated, the neutralization reaction is caused between aluminum sulfate and the alkali metal carbonate at 500° to 600° C. and decarboxylation takes place to form aluminum oxide and an alkali metal sulfate. This alkali metal sulfate and the alkali metal sulfate incorporated in advance are melted. When the temperature is elevated to 1000° to 1200° C., a whisker having the composition of $9Al_2O_3.2B_2O_3$ is grown.

It was found that if aluminum hydroxide is used instead of aluminum sulfate and an alkali metal sulfate is used instead of the alkali metal carbonate, and if the reaction is carried out under the same conditions as described above, a whisker cannot be grown.

The reason is that the aluminum oxide-forming temperature range differs, and this temperature range is from 500° to 600° C. in case of aluminum sulfate while the temperature range is from 200° to 300° C. in case of aluminum hydroxide.

The presence of an intermediate product considered to be an aluminum-boron spinel during the process of the synthesis of non-whisker $9Al_2O_3.2B_2O_3$ has been clarified (Osamu Yamaguchi et al., "Formation and Decomposition of $9Al_2O_3.2B_2O_3$ Prepared from Alkoxide", Journal of the Japanese Association of Chemistry, No. 1, pages 1 through 9, 1979). This spinel is readily formed at a temperature of 600 to 940° C. when the starting material is very fine as in the sol-gel method, and it is known that just after formation of an oxide by calcination of a metal salt, from the crystallographic viewpoint, respective ions are not sufficiently regularly oriented and the oxide has a high chemical activity. In the process of the present invention, it is considered that since aluminum sulfate is converted at 500° to 600° C. to aluminum oxide, this aluminum oxide reacts with the boric anhydride source component while retaining a sufficient activity, and an aluminum-boron spinel is formed. On the other hand, the reaction of forming aluminum oxide by dehydration of aluminum hydroxide takes place at 200° to 300° C., and this temperature is different by 300° C. or more from the lower limit temperature of the spinel-forming temperature range. Accordingly, it is considered that the activity possessed by aluminum oxide just after the formation is considerably lost during the elevation of the temperature, and hence, a spinel cannot be formed.

This spinel is a composite oxide containing aluminum and boron, and it is considered that a whisker is easily grown if this composite oxide is co-present with a flux. Accordingly, a whisker is hardly obtained by the process using aluminum hydroxide, in which a spinel is not formed as a by-product. This phenomenon is similarly observed when a needle crystal of mullite is synthesized by heating metakaolin, and the presence of an aluminum-silica spinel has been confirmed.

Furthermore, according to the present invention, in the neutralization between aluminum sulfate and the alkali metal carbonate, equivalent reaction is caused when the aluminum/alkali metal molar ratio is 1/3, and if the proportion of the alkali metal is smaller than this molar ratio, aluminum sulfate is left unreacted, and this aluminum sulfate reacts with the alkali metal sulfate present in the mixture at about 700° C. to form a trialkali metal aluminum trisulfate [M₃Al(SO₄)₃; M represents an alkali metal] and alum [MAl(SO₄)₂; M represents an alkali metal]. This alum is decomposed at about 800° C. to a trialkali metal aluminum trisulfate, aluminum oxide and sulfuric anhydride, which has been clarified by the X-ray diffractometrical analysis. It is known that the melting point of the trialkali metal aluminum trisulfate formed through the above-mentioned process is about 700° C. and the trialkali metal aluminum trisulfate is present stably at a temperature of up to 1000° C. where a whisker begins to grow. Accordingly, it is considered that this compound acts effectively not only as the aluminum source at the growth of the whisker but also as the flux component.

The present invention will now be described in detail with reference to the following examples and comparative examples that by no means limit the scope of the invention.

In the examples and comparative examples, the mole numbers of the starting materials are mole numbers of the metals contained in the starting materials, that is, aluminum, boron and the alkali metal.

EXAMPLES 1 THROUGH 6

A mixture comprising aluminum sulfate, a boric anhydride source component, an alkali metal sulfate and an alkali metal carbonate at a mixing ratio shown in Table 1 was pulverized and blended in a mortar, and the pulverized mixture was charged in an alumina crucible having an inner capacity of 50 ml. In an electric furnace, the temperature was elevated at a rate of 5° C. per minute and reaction was carried out at 1100° C. for 4 hours. The cooled reaction product was completely contracted like a sintered powder, and the reaction product was not stuck to the crucible at all and could be easily taken out from the crucible. About 200 ml of 1N hydrochloric acid was added to isolate and purify the reaction product and boiling was continued for about 8 hours to remove the flux component and unreacted component by the dissolution. The residue was washed with water and dried to obtain a whisker having the composition of 9Al₂O₃·2B₂O₃ The shape of the whisker, the amount obtained of the whisker and the yield of the whisker are shown in Table 1.

TABLE 4

|  | Example 1 | Example 2 | Example 3 | Example 4 | Example 5 | Example 6 |
|---|---|---|---|---|---|---|
| Al₂(SO₄) | 0.06 mole 10.27 g | 0.07 mole 11.98 g | 0.08 mole 13.69 g | 0.08 mole 13.69 g | 0.08 mole 13.69 g | 0.09 mole 15.40 g |
| H₃BO₃ | 0.04 mole 2.47 g |  | 0.02 mole 1.24 g | 0.02 mole 1.24 g |  |  |
| B₂O₃ |  |  |  |  | 0.02 mole 0.70 g |  |
| Na₂B₄O₇ |  | 0.03 mole 1.51 g |  |  |  | 0.02 mole 1.01 g |
| Na₂SO₄ | 0.08 mole 5.68 g |  |  | 0.09 mole 6.39 g |  |  |
| K₂SO₄ |  | 0.05 mole 4.36 g | 0.08 mole 6.97 g |  | 0.20 mole 17.43 g | 0.03 mole 2.61 g |
| Na₂CO₃ | 0.15 mole 7.95 g |  | 0.16 mole 8.48 g |  | 0.16 mole 8.48 g | 0.20 mole 10.60 g |
| K₂CO₃ |  | 0.20 mole 13.82 g |  | 0.10 mole 5.30 g |  |  |
| Shape of Whisker |  |  |  |  |  |  |
| thickness | 2 μm | 1.5 μm | 1 μm | 1 μm | 1 μm | 0.6 μm |
| length | 60 μm | 30 μm | 30 μm | 30 μm | 30 μm | 10 μm |
| Amount Obtained of Whisker | 2.82 g | 3.58 g | 4.46 g | 4.45 g | 4.37 g | 5.23 g |
| Yield of Whisker | 80% | 87% | 95% | 95% | 93% | 99% |

EXAMPLE 7

A magnetic ball mill having an inner capacity of 5 l was charged with 684.4 g (4.0 moles) of aluminum sulfate, 61.8 g (1.0 mole) of boric acid, 261.4 g (3.0 mols) of potassium sulfate and 477.0 g (9.0 moles) of sodium carbonate, and they were pulverized and mixed for about 8 hours. A part of the obtained starting mixture was charged in a stainless steel mold having an inner diameter of 110 mm and tabulated under a total pressure of about 20 tons. The height of the tablet was about 40 mm and the weight was 450 g. The tablet was placed on an alumina plate having a diameter of 130 mm and a thickness of 5 mm, and in an electric furnace, the temperature was elevated at a rate of 5° C. per minute and reaction was carried out at 1150° C. for 4 hours. The cooled reaction product retained the shape of the tablet and was not stuck to the alumina plate at all but could be easily taken out. The reaction product was immersed in about 2 l of water and boiling was carried out for about 8 hours to remove the flux by the dissolution. Then, about 500 ml of 1N hydrochloric acid was added to the recovered solid and boiling was carried out for about 1 hour to remove the unreacted component by the dissolution. The residue was washed with water and dried to obtain a whisker having the composition of 9Al₂O₃·2B₂O₃. The amount obtained of the whisker was 67 g and the yield was 95%. The whisker had a thickness of 1 to 2 μm and a length of 20 to 40 μm.

EXAMPLE 8

To 450 g of the starting mixture obtained by the ball mill treatment in Example 7 was added about 100 ml of a wax solution diluted to 50% with methylethylketone, and the mixture was stirred by a stirrer to form a slurry. The slurry was charged in a wood mold having a size of 80 mm and molded under a total pressure of 50 kg. The tablet was air-dried to remove the majority of methylethylketone by evaporation. Then, the tablet was placed on a brick formed of mullite, and in an electric furnace, the temperature was elevated at a rate of 5° C. per minute and reaction was carried out at a temperature of 1150° C. for 4 hours. In the midway, the wax component was burnt. The cooled reaction product retained the shape of the tablet, and the reaction product was not stuck to the brick at all but could be easily taken out. The reaction product was treated under the same conditions as described in Example 7 to obtain a whisker having the same size as that of the whisker obtained in Example 7. The amount obtained of the whisker was 65 g and the yield was 92%.

COMPARATIVE EXAMPLE 1

A mixture comprising 3.12 g (0.08 mole) of aluminum hydroxide, 3.02 g (0.06 mole) of sodium tetraborate and 5.84 g of sodium chloride was pulverized and blended in a mortar, and the obtained starting mixture was charged in an alumina crucible. In an electric furnace, the temperature was elevated at a rate of 5° C. per minute and reaction was carried out at 1100° C. for 4 hours. In the cooled reaction product, there was a trace indicating that the reaction mixture was completely melted, and the reaction product was a glassy product stuck tightly to the crucible. Accordingly, the reaction product could not be taken out. For isolating the whisker, the crucible with the reaction product stuck thereto was immersed in 200 ml of 1N hydrochloric acid and the boiling treatment was carried out to remove the flux and unreacted component by the dissolution. Since the boron component formed a glass with other components, only the top surface of the content in the crucible was sufficiently contacted with hydrochloric acid, and therefore, such a long time as 50 hours was necessary for completion of this treatment. The recovered product was washed with water and dried to obtain a whisker having the composition of $9Al_2O_3.2B_2O_3$ which had such a large size as a thickness of 1 to 3 μm and a length of 20 to 60 μm. The amount obtained of the whisker was 0.7 g and the yield was only 31%.

The inner surface of the used alumina crucible was corroded in the vicinity of the liquid level, and a weight loss of about 1% was observed. When potassium chloride, sodium sulfate or potassium sulfate was used instead of sodium chloride, similar results were obtained.

As is apparent from the foregoing description, the process of the present invention is advantageous over the conventional processes in that an aluminum borate whisker can be prepared in a high yield on an industrial scale without using any particular reaction vessel.

We claim:

1. A method for preparing a $9Al_2O_3.2B_2O_3$ whisker comprising the steps of
   (I) forming a raw material mixture by mixing and pulverizing
      (a) an aluminum supply component comprising aluminum sulfate,
      (b) boric anhydride supply component comprising at least one compound selected from the group consisting of boron oxides, oxyacids of boron, and alkali metal salts thereof,
      (c) a neutralization agent, comprising at least one compound selected from the group consisting of sodium carbonate and potassium carbonate, and
      (d) a fluxing agent selected from the group consisting of sodium sulfate, potassium sulfate, and mixtures thereof,
   wherein the amounts of (a), (b), (c) and (d) are such that, in the following steps (II) the molar ratio of aluminum in (a) to born in (b) is in the range of from 6:4 to 9:2, the molar ratio of aluminum in (a) to alkali metal in
      (c) is in the range from 1:1 to 1:3, and the molar ratio of aluminum in (a) to alkali metal in
      (d) is in the range of from 3:1 to 1:2.5,
   (II) pressure molding the mixture of step (I) into a tablet, and
   (III) heating the tablet at a temperature of from 1,000° C. to 1,200° C. to convert said raw materials in said tablet to aluminum borate whisker without substantially changing the shape of said tablet.

* * * * *